(12) United States Patent
Boyd et al.

(10) Patent No.: US 7,864,502 B2
(45) Date of Patent: Jan. 4, 2011

(54) IN SITU MONITORING OF WAFER CHARGE DISTRIBUTION IN PLASMA PROCESSING

(75) Inventors: Kevin M Boyd, Poughkeepsie, NY (US); James A Gallo, Essex Junction, VT (US); Edward P Higgins, Ripton, VT (US); Mark L Reath, Red Hook, NY (US); Barbara L Shiffler, Hinesburg, VT (US); Justin Wong, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 437 days.

(21) Appl. No.: 11/748,560

(22) Filed: May 15, 2007

(65) Prior Publication Data

US 2008/0285202 A1    Nov. 20, 2008

(51) Int. Cl.
 *H01T 23/00* (2006.01)
 *H01L 21/683* (2006.01)
(52) U.S. Cl. .......................... 361/234; 361/230; 438/5
(58) Field of Classification Search ................. 361/234, 361/230; 438/5
See application file for complete search history.

(56) References Cited

U.S. PATENT DOCUMENTS

| | | | |
|---|---|---|---|
| 5,793,192 A | 8/1998 | Kubly et al. | |
| 6,228,278 B1 * | 5/2001 | Winniczek et al. | ............ 216/61 |
| 6,328,041 B1 | 12/2001 | Brown et al. | |
| 6,361,645 B1 | 3/2002 | Schoepp et al. | |
| 7,063,988 B1 | 6/2006 | Rha et al. | |
| 7,169,255 B2 | 1/2007 | Yasui et al. | |
| 7,583,492 B2 * | 9/2009 | Howald | ..................... 361/234 |
| 2004/0031699 A1 * | 2/2004 | Shoji | ...................... 205/791.5 |
| 2006/0226786 A1 * | 10/2006 | Lin et al. | ............... 315/111.21 |

\* cited by examiner

*Primary Examiner*—Stephen W Jackson
*Assistant Examiner*—Zeev Kitov
(74) *Attorney, Agent, or Firm*—Joseph Petrokaitis; Roberts Mlotkowski Safran & Cole, P.C.

(57) ABSTRACT

A processing system and method. The processing system includes a processing tool, an electrostatic chuck (ESC) arranged within the processing tool, and a system that at least one of detects at least one of an ESC bias spike and an ESC current spike of the ESC and determines when an ESC bias voltage is zero or exceeds a threshold value. The method includes at least one of detecting at least one of an ESC bias spike and an ESC current spike of the ESC, and determining when an ESC bias voltage is zero or exceeds a threshold value. The system and method can be used in real time ESC and plasma processing diagnostics to minimize yield loss and wafer scrap.

27 Claims, 12 Drawing Sheets

FIG. 7
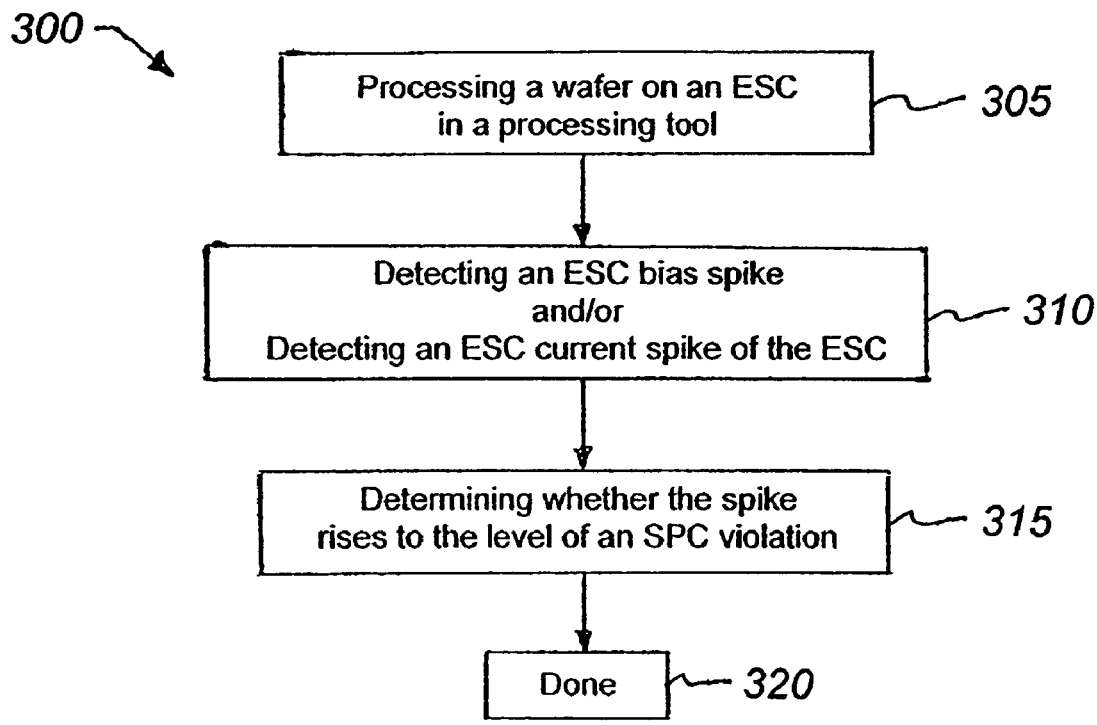
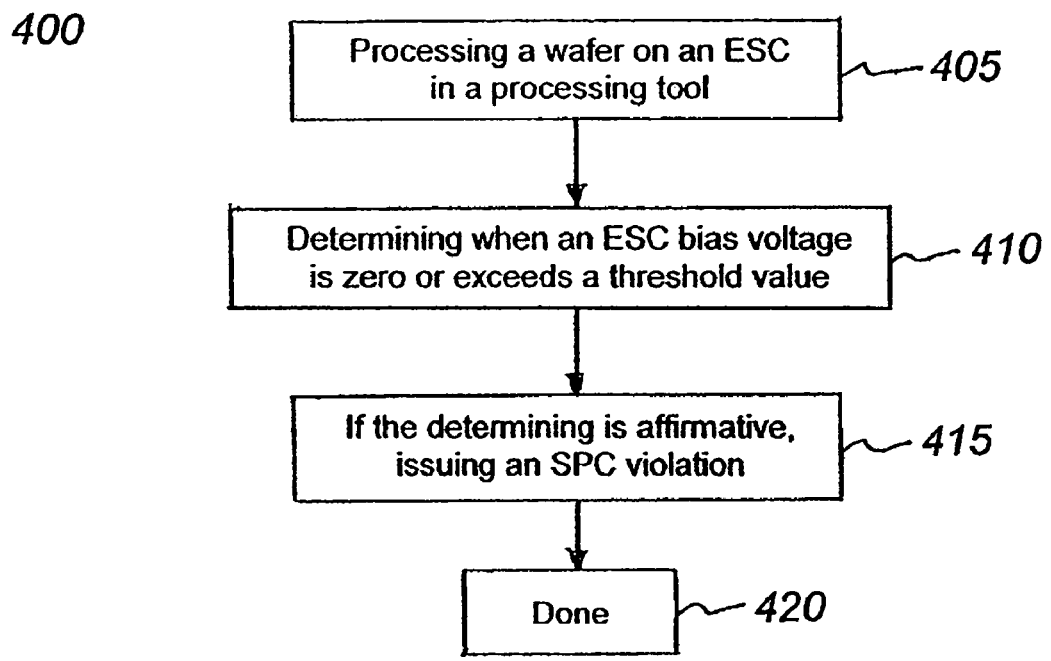
FIG. 8

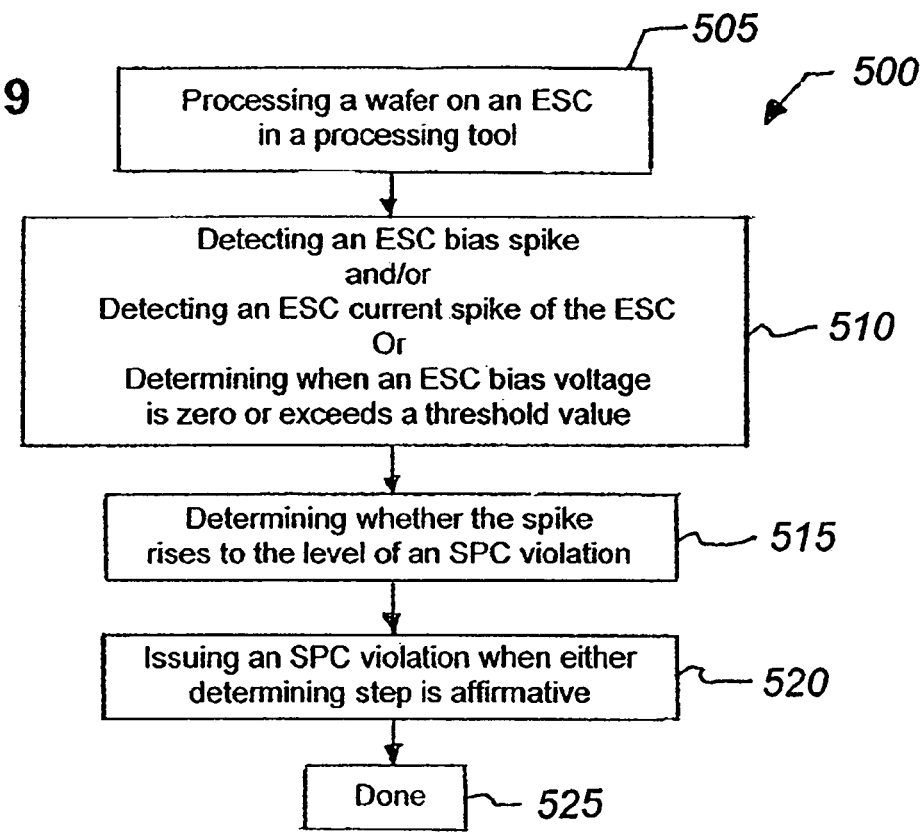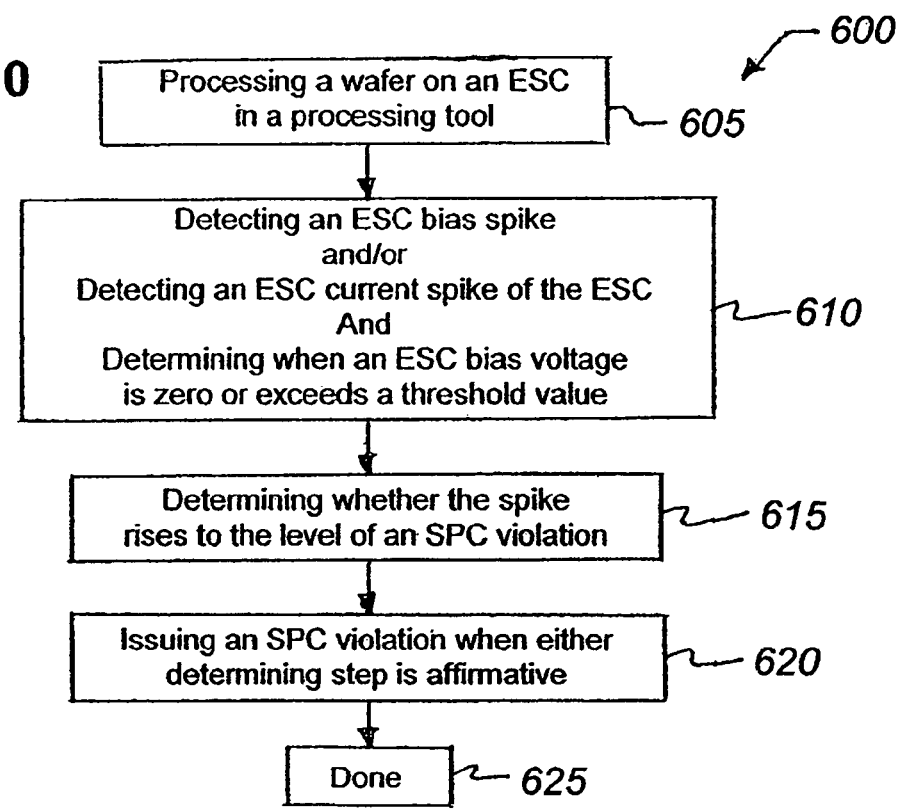

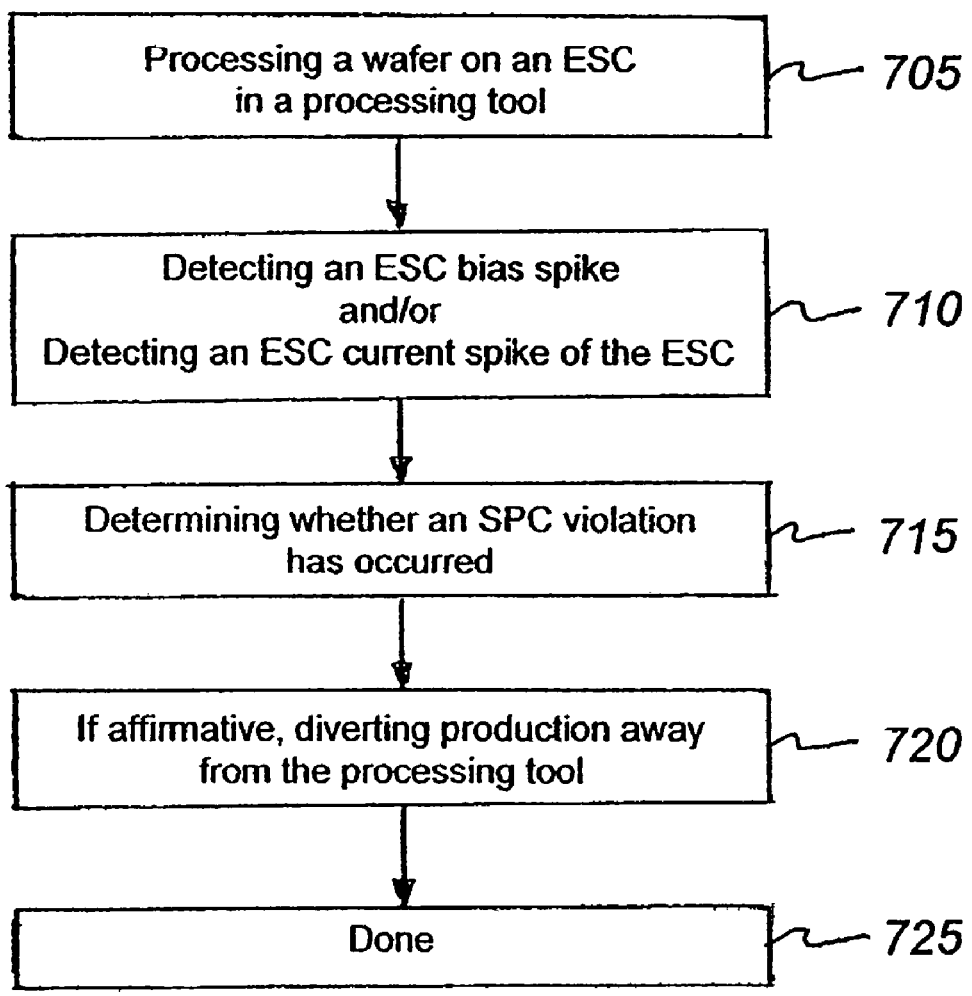

IN SITU MONITORING OF WAFER CHARGE DISTRIBUTION IN PLASMA PROCESSING

FIELD OF THE INVENTION

The present invention relates to the manufacture of semiconductor devices. More specifically, the present invention relates to methods and apparatuses for electrostatically clamping and declamping a semiconductor wafer on an electrostatic chuck (ESC) in a processing chamber of a semiconductor wafer processing system. The invention also relates to monitoring and/or detecting ESC voltage, ESC current, and/or ESC bias in order to determine whether a statistical process control (SPC) violation has occurred.

BACKGROUND OF THE INVENTION

The use of electrostatic chucks in wafer processing systems is known. In wafer processing, wafers can be processed in a plasma processing system which may be used for etching (e.g., reactive ion etching RIE), oxidation, annodization, chemical vapor deposition (CVD), physical vapor deposition (PVD), and other processes associated with the manufacture of semiconductor wafers.

The plasma processing system typically includes a plasma processing chamber and one or more radio frequency (RF) (and/or direct current (DC)) power supplies. Within the plasma processing chamber, there may be disposed a shower head and an electrostatic chuck. The shower head is typically employed to distribute (process) gases into a plasma region of plasma processing chamber and may be made of a non-conductive material such as quartz.

When one or both of RF power supplies are energized, a plasma is created within a plasma region out of the source etchant gases. A wafer is disposed atop the electrostatic chuck to be processed by the plasma. The electrostatic chuck may be made of a suitable conductive material, such as an aluminum alloy, and may have any number of configurations. At the top surface of the electrostatic chuck, there is typically disposed a dielectric layer. Between the electrostatic chuck and the wafer, a heat transfer gas, e.g., helium, may be provided under pressure via a port to the wafer/chuck interface. The heat transfer gas acts as a heat transfer medium between the wafer and the electrostatic chuck to facilitate control of the wafer temperature during processing.

To securely clamp the wafer to the electrostatic chuck during processing, electrostatic forces are induced by a direct current power supply. In the case of a bipolar chuck, two poles may be biased with direct current potentials having opposite polarities. For example, one pole may be biased positively and another pole may be biased negatively. The direct current potential in each electrostatic pole creates a potential difference between the top surface of the pole and the corresponding overlying region in the bottom surface of the wafer, thereby generating an electrostatic force to hold the wafer to the electrostatic chuck.

When it is desired to remove the wafer from the chuck, a phenomenon called "wafer sticking" can sometimes occur. The phenomenon occurs when residual charge is left on the chuck dielectric or the wafer surface leading to undesired electric field and clamping force. This may arise because of uncompensated direct current (DC) bias and/or charge accumulated on the chuck surface or on the wafer due to excessive local field, which may cause field emission tunneling across the interface gap. Generally, charge is bled away when power is turned off to the electrostatic chuck. However, if charge does not go to zero or remains above a threshold value, the resulting residual charge may make it difficult to remove the wafer from the chuck. This sticking or de-chuck fault can create problems.

One problem created by the sticking is that the attempted lifting of the wafer off of the chuck can create "spray". That is, sticking can cause the wafer to be subjected to stress during the de-chucking which can damage the wafer and result in "spray". When pins in the chuck attempt to lift a sticky wafer off the chuck surface, particles of the wafer (and in particular from the edges of the wafer) may be broken off the wafer and these particles can be sprayed into the atmosphere of the processing chamber. Some of these particles can find their way onto the wafer surface. This can cause electrical opens due to block metal deposition. This "spray" is undesirable and is a symptom of sticking. The sticking, furthermore, is a symptom or an indicator of a possible SPC violation.

When it is desired to de-chuck the wafer, the power to the ESC is turned off so that the electrostatic force can be removed. However, this does not always occur and occasionally the wafer remains stuck to the ESC due to the presence of trapped charge within the ESC. The trapped charge may be due to the formation of a non-ohmic contact interface within the ESC. Trapped charge at potentials of (e.g., +50 to +150 volts) within the ESC causes substantial clamping force on the wafer. As a result, the wafer remains partially clamped even though the ESC power supply is in the "off" state. If the wafer is mechanically removed from the chamber while the ESC is in a partially clamped state, this can place stress on the wafer which causes mechanical damage and generates foreign material, commonly known as "ESC spray defects".

Furthermore, RIE, CVD or PVD can impart a charge to the wafer due to ion bombardment of the wafer surface. Changes in the charge distribution across the surface of the wafer are measurable in the ESC bias and ESC current parameters. Plasma instabilities, charging and electrostatic discharge within the reaction chamber create temporal disturbances to ion flux to the wafer, which, in turn cause corresponding changes to the wafer charge distribution, that are measureable as changes in the ESC bias and ESC current. These and other plasma perturbations can lead to temporal distortions in the plasma flux, causing surface charge rearrangement as measurable in the ESC bias and ESC current.

For example, the electrostatic (arc) discharges are particularly problematic within RIE, CVD, and PVD processes that result in temporal disturbances to the ion flux reaching the wafer surface. Disturbances in the ion flux cause disturbances in the charge distribution across the wafer that are measurable in the ESC bias and ESC current parameters. Similarly, an arc discharge to the wafer can damage the wafer and can create a perturbation in the wafer surface charge distribution, resulting in current flow into or out of the ESC. That is, the arc can create a spike in the ESC bias as well as a spike in the ESC current. Such spikes in the ESC bias and ESC current are undesirable and are a symptom or indicator of a possible SPC violation. That is, they can be indicative of a problem with the processing tool specifically a charge buildup within the tool and subsequent high voltage discharge at or near the wafer. This results in physical damage to the internal components of the reactor, physical damage to the wafer and electrical damage to the semiconductor devices present on or within the wafer.

Although conventional RIE, CVD and PVD processing tools currently provide information about the ESC bias voltage and current, this information is not utilized to determine whether the power subsystems, ESC and other internal reactor components, (and by extension the processing tool) is functioning properly, and/or is not utilized to determine whether wafers produced by a processing tool could possibly be in violation of SPC.

In view of the foregoing, there is a need for improved methods and apparatuses or systems for preventing sticking and/or for determining when a processing tool is processing wafers which have failed, are likely to fail, or will soon fail or result in an SPC violation. That way, the processing tool can be flagged for repair or maintenance to correct the possible problems with, e.g., the chuck and/or shower head. Furthermore, the processing tool can be bypassed so that no wafers are processed by the possibly malfunctioning processing tool until it is repaired or otherwise brought into conformance with SPC requirements.

SUMMARY OF THE INVENTION

In a first aspect of the invention, a processing system includes a processing tool. An electrostatic chuck (ESC) is arranged within the processing tool. A system is utilized that at least one of detects at least one of an ESC bias spike and an ESC current spike of the ESC and determines when an ESC bias voltage is zero or exceeds a threshold value.

In a second aspect of the invention, a processing system includes a processing tool. An electrostatic chuck (ESC) is arranged within the processing tool. A system is utilized that determines when at least one of an ESC bias voltage of the ESC and of a wafer arranged on the ESC is zero or exceeds a threshold value.

In a third aspect of the invention, a processing system includes a processing tool. An electrostatic chuck (ESC) is arranged within the processing tool. A system is utilized that detects at least one of an ESC current spike and an ESC bias spike of at least one of a wafer and the ESC.

In a fourth aspect of the invention, a method of processing wafers in a processing tool includes an electrostatic chuck (ESC). The method includes at least one of detecting at least one of an ESC bias spike and an ESC current spike of the ESC and determining when an ESC bias voltage is zero or exceeds a threshold value.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 7 shows a first embodiment of a processing method according to the invention;

FIG. 8 shows a second embodiment of a processing method according to the invention;

FIG. 9 shows a third embodiment of a processing method according to the invention;

FIG. 10 shows a fourth embodiment of a processing method according to the invention;

FIG. 11 shows a fifth embodiment of a processing method according to the invention;

DETAILED DESCRIPTION OF EMBODIMENTS OF THE INVENTION

Figure 1:
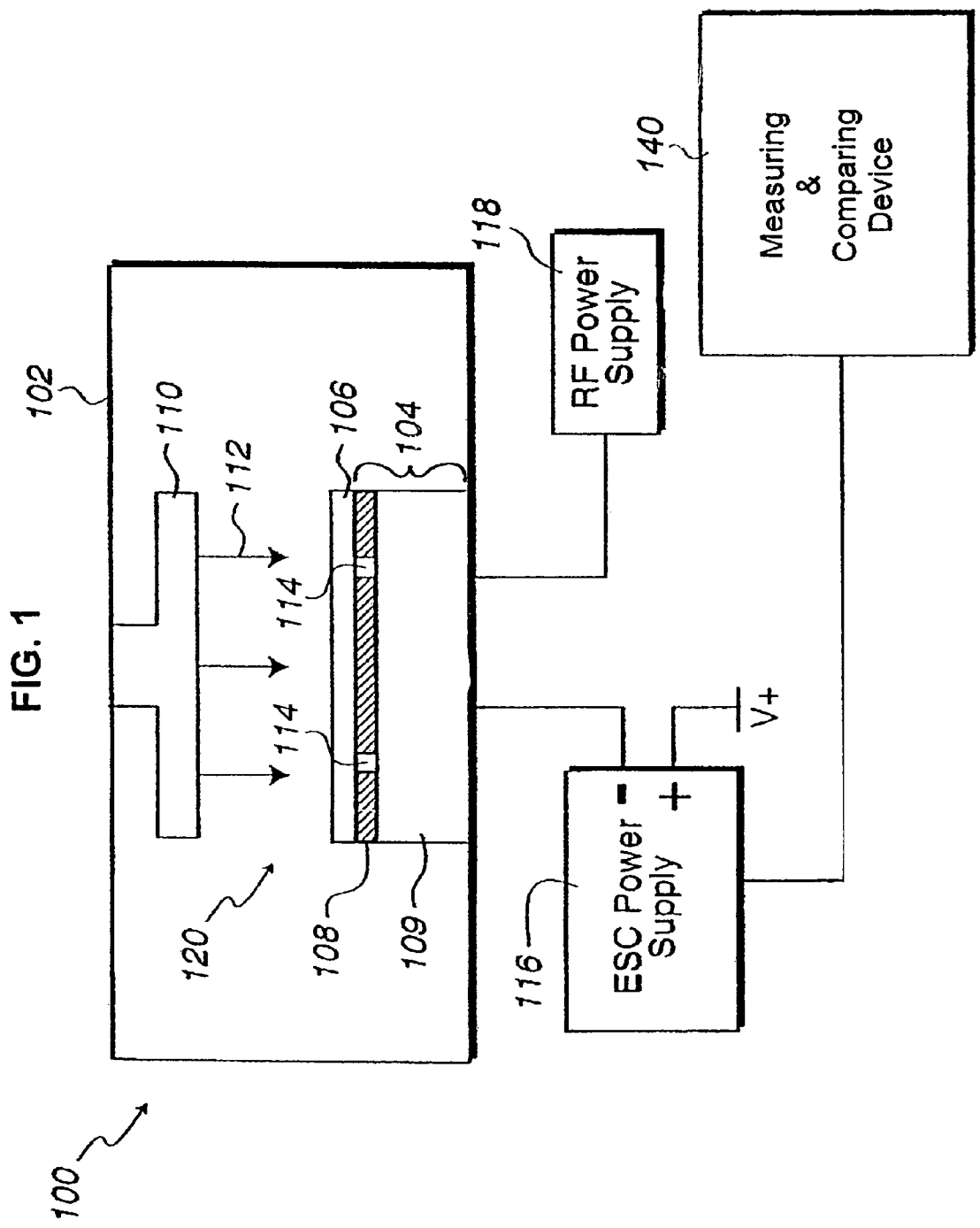
FIG. 1 shows a first embodiment of a processing system according to the invention.

The present invention relates to the manufacture of semiconductor devices. More specifically, the present invention relates to methods and apparatuses for electrostatically clamping and declamping a semiconductor wafer on an electrostatic chuck (ESC) in a processing chamber of a semiconductor wafer processing system. The invention also aims to solve one or more of the problems noted herein by real time monitoring and multivariate processing of electrical signals from the ESC, RF and DC power subsystems present on semiconductor processing tools.

The present invention also relates to monitoring and/or detecting ESC voltage, ESC current, and/or ESC bias (e.g., by using tool trace data) in order to determine whether there is a problem with the processing tool and, in particular, whether there is a problem with the ESC (e.g., a ESC chuck default) and/or the shower head. Trace data analysis of several ESC spray events performed by Applicant indicates that the phenomenon can be detected with existing FDC or univariate statistical process control (SPC) techniques, provided that the correct framing intervals are applied to the dataset.

The present invention also relates to monitoring and/or detecting ESC voltage, ESC current, and/or ESC bias in order to determine, e.g., whether sufficient residual clamping voltage exists on the wafer or ESC at the time of declamping which can trigger an SPC violation. If it is determined that an SPC violation has occurred, the processing tool can be identified or flagged as requiring inspection, maintenance, and/or repair. Additionally or alternatively, if it is determined that an SPC violation has occurred, the processing tool can be identified or flagged as requiring inspection, maintenance, and/or repair.

The present invention also aims to prevent "spray". When it is desired to de-chuck a wafer, the power to the ESC is turned off so that the electrostatic force can be removed. However, this does not always occur and it sometimes happens that the wafer remains stuck to the ESC. Furthermore, RIE or CVD can impart a charge to the wafer. Changes in the charge distribution across the surface of the wafer are measurable in the ESC bias and ESC current parameters. Plasma instabilities, charging and electrostatic discharge within the reaction chamber create temporal disturbances to ion flux to the wafer, which, in turn cause corresponding changes to the wafer charge distribution, that are measureable as changes in the ESC bias and ESC current. Therefore, the ESC bias and ESC current measurements can form the basis for plasma fault detection and diagnostics, specifically to determine the plasma instabilities, electrostatic charging, and electrostatic discharge which lead to reactor and wafer damage. With appropriate skill and practice, one can define SPC controls to take tools out of production before wafer damage has occurred, thus using the ESC bias and current parameters to predict an increasing probability of wafer damage and financial loss. In this way, the ESC parameters can form the basis for predictive tool maintenance.

An arc to the wafer can damage the wafer and can also create a perturbation in the wafer surface charge distribution. This can induce current flow in the ESC. That is, the arc can create a spike in the ESC bias as well as a spike in the ESC current. Accordingly, the invention also relates to a measuring and/or comparing device that is used to measure, detect, or record one or more of the following features: (1) the ESC bias voltage; (2) whether an ESC bias spike has occurred; and (3) whether an ESC current spike has occurred. The device is preferably connected to the portion of the processing tool which provides the real-time data on these features and can be connected to a circuit the of ESC power supply 116.

FIG. 1 illustrates an exemplary plasma processing system that includes a processing tool 100 utilizing a monopolar electrostatic chuck (ESC) 104. The plasma processing tool 100 includes a plasma processing chamber 102, a radio frequency (RF) power supply 118, and an ESC power supply 116. Disposed within the plasma processing chamber 102 are a shower head 110, the ESC 104, and a semiconductor wafer 106 disposed over the ESC 104. The shower head 110 is typically used to release source gases 112 into a plasma region 120 of plasma processing chamber 102 and may be made of a non-conductive material such as quartz.

When the RF power supply 118 is energized, a plasma is created within plasma region 120 out of the source gases. The wafer 106 is disposed over the electrostatic chuck 104 to be processed by the plasma. The electrostatic chuck 104 includes a dielectric layer 108 disposed over a metal layer 109. The metal layer 109 serves as an electrostatic pole (i.e., electrode) and is negatively biased in the monopolar ESC configuration of FIG. 1. A heat transfer gas (e.g., helium) is provided under pressure via a port 114 between the ESC 104 and the wafer 106. The gas acts as a heat transfer medium between the wafer 106 and the ESC 104 to facilitate control of the wafer temperature during processing.

To securely clamp the wafer 106 to the ESC 104 during processing, the ESC power supply 116 is activated. When the plasma is generated in the plasma region 120, the plasma essentially functions as a resistor coupled between the wafer 106 and ground. In this configuration, an ESC pole is biased with the negative direct current potential. The direct current potential in the ESC pole creates a potential difference between the top surface of the pole and the bottom surface of the wafer, thereby generating an electrostatic force to hold the wafer 106 in place with respect to the ESC 104.

When it is desired to de-chuck the wafer 106, the power to the ESC 104 is turned off so that the electrostatic force can be removed. However, this does not always occur and it sometimes happens that the wafer 106 remains stuck to the chuck 104. Furthermore, RIE can impart a charge to the wafer 106 resulting in a charge rearrangement that can lead to an arc-event. An arc to the wafer 106 can damage the wafer and can also create a perturbation in the wafer surface charge distribution. This can induce current flow in the ESC 104. That is, the arc can create a spike in the ESC bias as well as a spike in the ESC current. Accordingly, a measuring and/or comparing device 140 is used to measure, detect, or record one or more of the following features: (1) the ESC bias voltage; (2) whether an ESC bias spike has occurred; and (3) whether an ESC current spike has occurred. The device 140 is preferably connected to the portion of the processing tool 100 which provides the real-time data on these features and can be connected to a circuit the ESC power supply.

If, for example, the ESC bias voltage is zero or less than a threshold value, the wafer 106 can be safely lifted off of the surface of the ESC 104. If however, the ESC bias voltage is not zero or greater than a threshold value, the wafer 106 is not caused to be lifted off of the surface of the ESC 104, and instead an indication is produced informing the processing control system or a user thereof that there is a problem with processing tool 100, and, more specifically, that there is a problem with the ESC 104.

If, for example, an ESC bias spike and/or an ESC current spike has been recorded or measured and determined to be indicative of a faulty or malfunctioning shower head 110, an indication can be produced informing the processing control system or a user thereof that there is a problem with processing tool, and, more specifically, that there is a problem with the shower head 110.

Additionally or alternatively, if, for example, an ESC bias spike and/or an ESC current spike has been recorded or measured and determined to be indicative of an electrostatic discharge at or near the wafer surface, due to a charge buildup within the reactor, the processing control system can be automatically informed that there is a problem with processing tool 100, and, more specifically, that there is a problem with the shower head 110.

The information about the ESC bias voltage and/or whether an ESC bias or current spike has occurred is then used by the Process Control System 160 to determine when and if an SPC violation has occurred. Furthermore, if an SPC violation has occurred, other wafers can automatically be diverted away from the processing tool 100 and, e.g., diverted to other properly functioning processing tools. Additionally, the processing tool 100 can be automatically identified or flagged as requiring inspection, maintenance, and/or repair. Finally, the wafer present in the chamber during the electrostatic discharge can be examined for physical and electrical defects to determine the extent of wafer damage.

Figure 2:
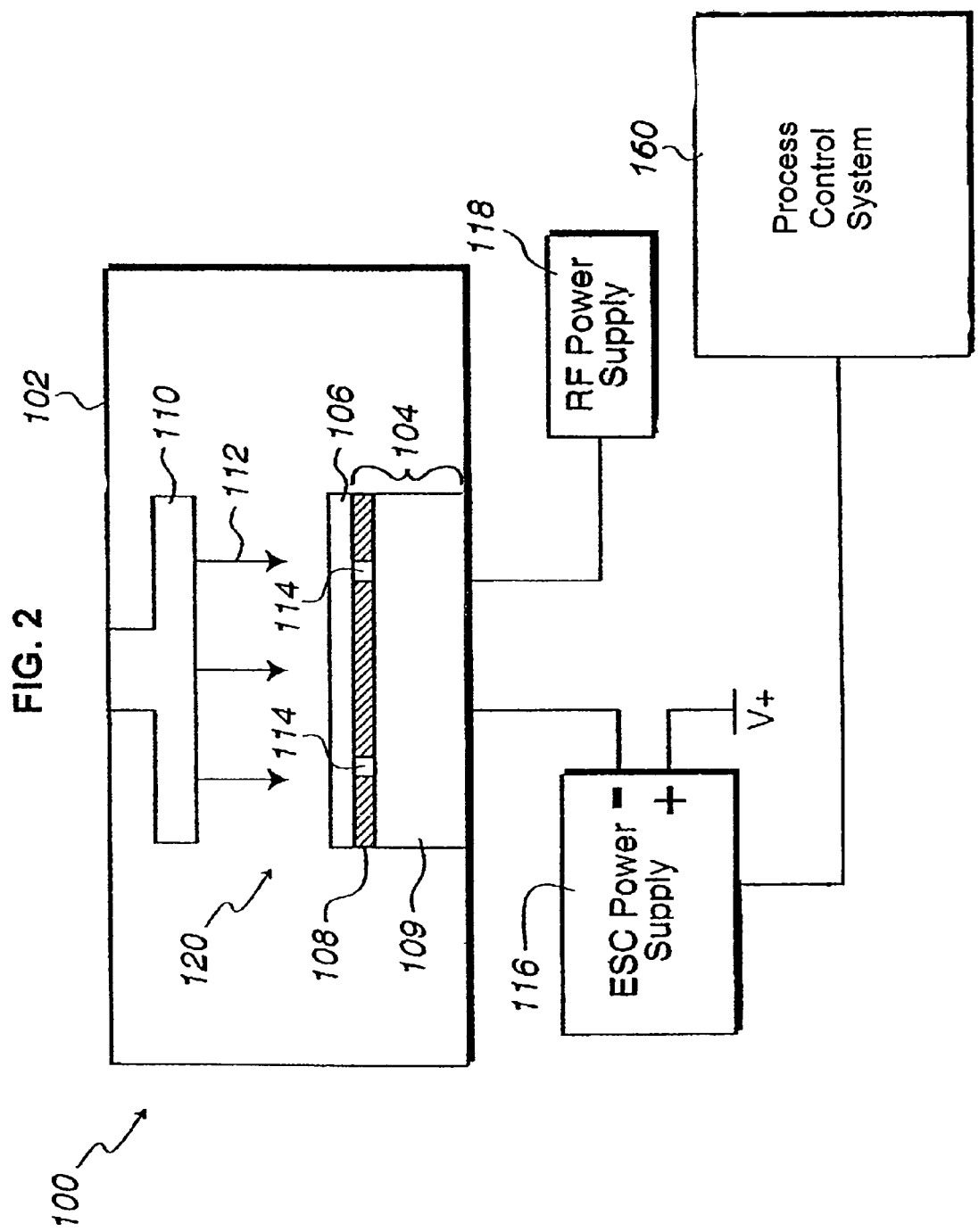
FIG. 2 shows a second embodiment of a processing system according to the invention.

FIG. 2 illustrates another exemplary plasma processing system that includes a processing tool 100 having a monopolar ESC 104. The plasma processing tool 100 is similar to that of FIG. 1 except that it is connected to or in communication with the Process Control System 160. The Process Control System 160 performs all of the functions of typical process control systems used to process wafers in an automated facility, but additionally measures, detects, or records one or more of the following features: (1) the ESC bias voltage; (2) whether an ESC bias spike has occurred; and (3) whether an ESC current spike has occurred. Then, the system 160 compares the measured results to predetermined values, ranges, curves, and automatically determines whether there is a possible SPC violation.

If, for example, the ESC bias voltage is zero or less than a threshold value, the wafer 106 can be safely lifted off of the surface of the ESC 104. If however, the ESC bias voltage is not zero or greater than a threshold value, the wafer 106 is not caused to be lifted off of the surface of the ESC 104, and instead an indication is produced automatically informing the processing control system 160 thereof that there is a problem with processing tool, and, more specifically, that there is a problem with the ESC 104.

If, for example, an ESC bias spike and/or an ESC current spike has been recorded or measured and determined to be indicative of an electrostatic discharge at or near the wafer surface, due to a charge buildup within the reactor, the processing control system can be automatically informed that there is a problem with processing tool 100, and, more specifically, that there is a problem with the shower head 110.

The information about the ESC bias voltage and/or whether an ESC bias or current spike has occurred is then used by the Process Control System 160 to determine when and if an SPC violation has occurred. Furthermore, if an SPC violation has occurred, other wafers can automatically be diverted away from the processing tool 100 and, e.g., diverted to other properly functioning processing tools. Additionally, the processing tool 100 can be automatically identified or flagged as requiring inspection, maintenance, and/or repair. Finally, the wafer present in the chamber during the electrostatic discharge can be examined for physical and electrical defects to determine the extent of wafer damage.

Figure 3:
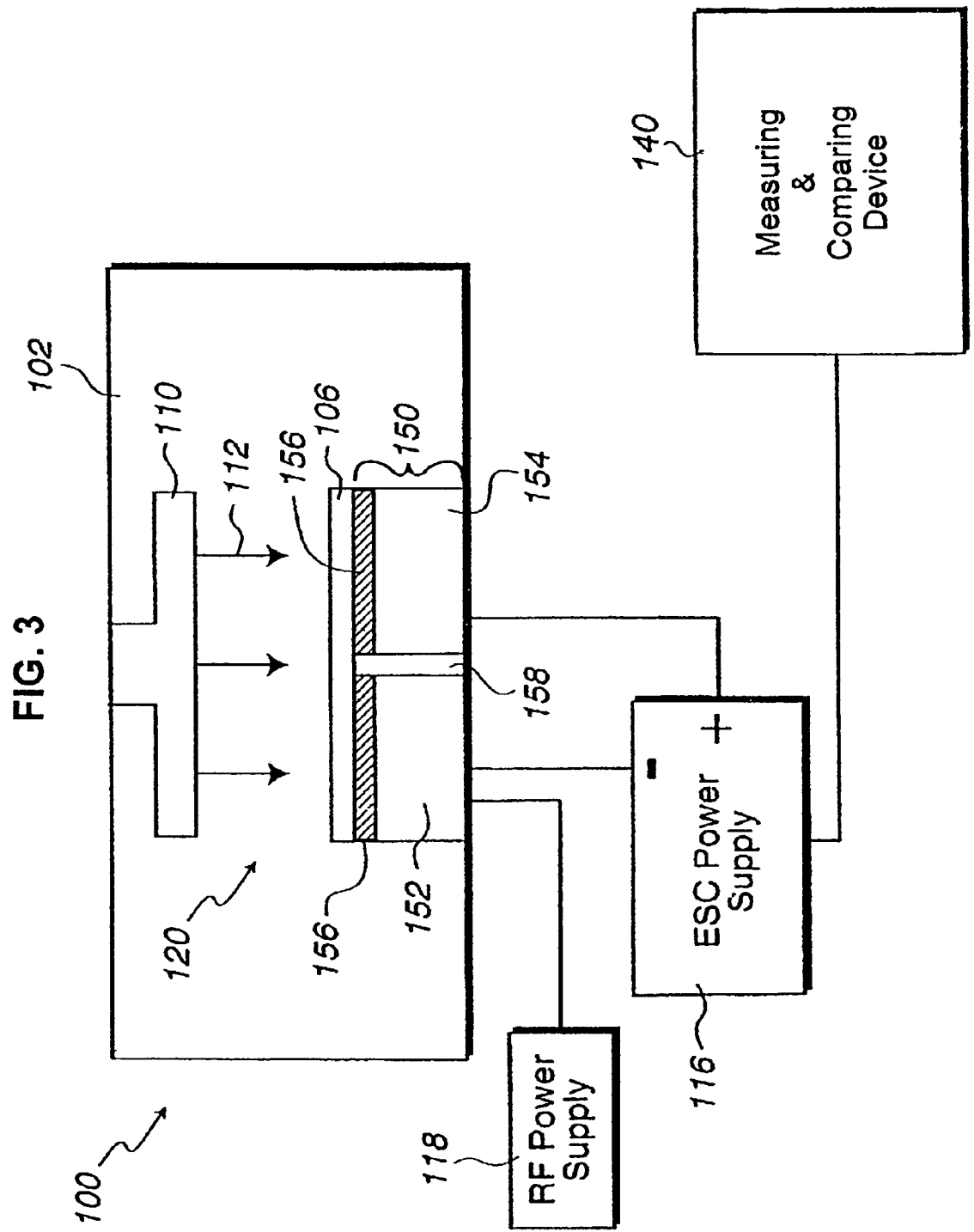
FIG. 3 shows a third embodiment of a processing system according to the invention.

FIG. 3 illustrates another plasma processing system that includes processing tool 100 having a bipolar ESC 150 instead of the monopolar electrostatic chuck shown in FIGS. 1 and 2. The bipolar ESC 150 has a pair of metal portions 152 and 154. The metal portion 152 is coupled to a negative terminal of the ESC power supply 116 while the metal portion 154 is coupled to a positive terminal of the ESC power supply 116. These metal portions 152 and 154 function as a pair of electrodes with a negative pole and a positive pole, respectively. The RF power supply 118 is coupled to the ESC 150 to excite the plasma. Disposed on top of the metal portions is a dielectric layer 156. A feed-tube 158 is formed through the ESC 150 to supply a cooling gas (e.g., helium) to the wafer 106 during processing.

When the ESC and RF power supplies are activated along with the shower head 110 to release plasma into the plasma region, a positive potential and a negative potential are induced on the positive and negative poles, respectively, thereby generating electrostatic forces between the poles and the respective overlaying wafer regions. The electrostatic forces hold the wafer 106 in place with respect to the electrostatic chuck 150 during processing.

If, for example, the ESC bias voltage is zero or less than a threshold value, the wafer 106 can be safely lifted off of the surface of the ESC 150. If however, the ESC bias voltage is not zero or greater than a threshold value, the wafer 106 is not caused to be lifted off of the surface of the ESC 150, and instead an indication is produced informing the processing control system or a user thereof that there is a problem with processing tool 100, and, more specifically, that there is a problem with the ESC 150. The process tool should be removed from production, and the affected wafer should be inspected for the aforementioned spray defects.

If, for example, an ESC bias spike and/or an ESC current spike has been recorded or measured and determined to be indicative of an electrostatic discharge at or near the wafer surface, due to a charge buildup within the reactor, the processing control system can be automatically informed that there is a problem with processing tool 100, and, more specifically, that there is a problem with the shower head 110.

The information about the ESC bias voltage and/or whether an ESC bias or current spike has occurred is then used by the Process Control System 160 to determine when and if an SPC violation has occurred. Furthermore, if an SPC violation has occurred, other wafers can automatically be diverted away from the processing tool 100 and, e.g., diverted to other properly functioning processing tools. Additionally, the processing tool 100 can be automatically identified or flagged as requiring inspection, maintenance, and/or repair. Finally, the wafer present in the chamber during the electrostatic discharge can be examined for physical and electrical defects to determine the extent of wafer damage.

Figure 4:
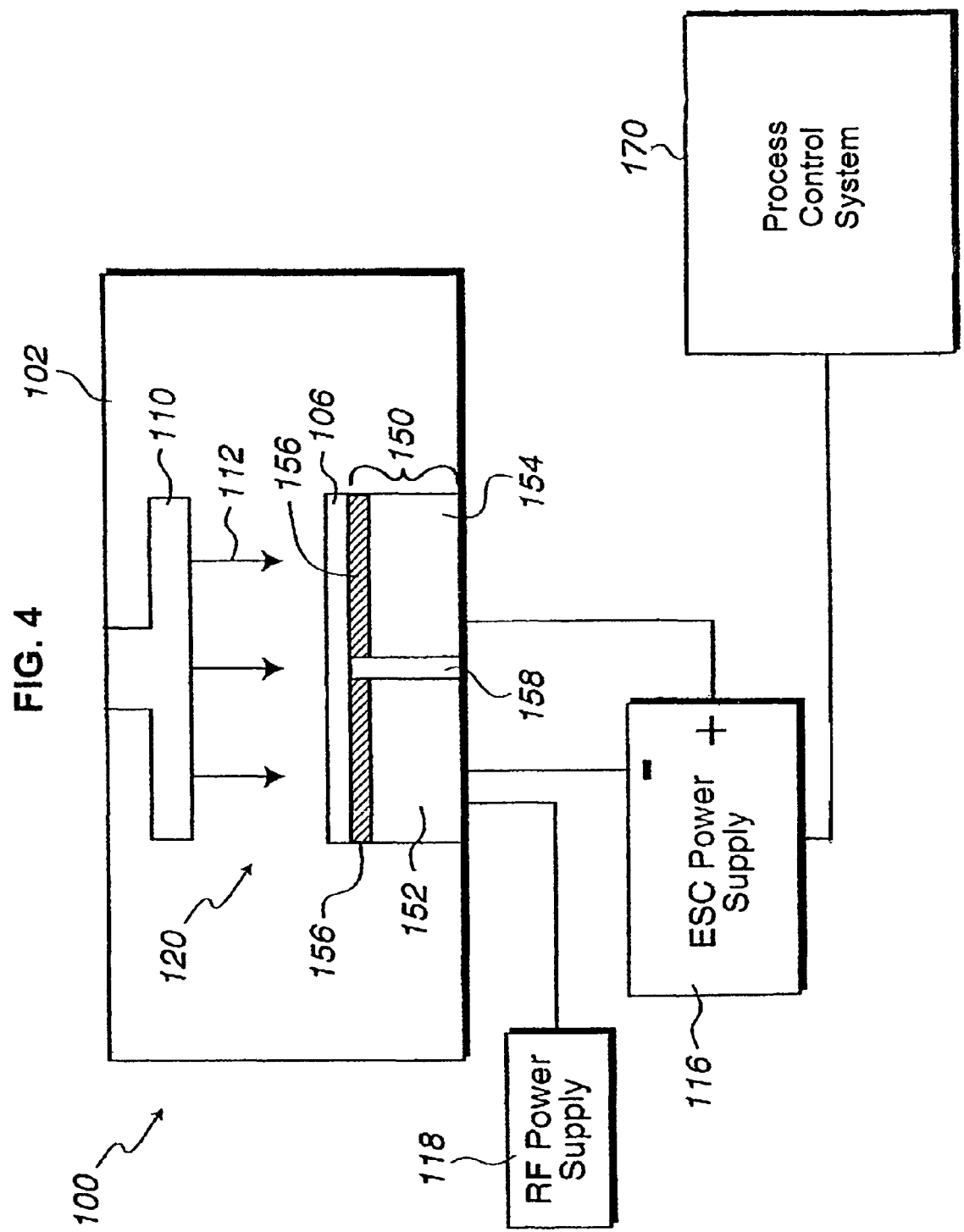
FIG. 4 shows a fourth embodiment of a processing system according to the invention.

FIG. 4 illustrates another exemplary plasma processing system utilizing a processing tool 100 that includes a bipolar ESC 150. The plasma processing tool 100 is similar to that of FIG. 3 except that it is connected to or in communication with the Process Control System 170. The Process Control System 170 performs all of the functions of typical process control systems used to process wafers in automated facility, but additionally measures, detects, or records one or more of the following features: (1) the ESC bias voltage; (2) whether an ESC bias spike has occurred; and (3) whether an ESC current spike has occurred. Then, the system 170 compares the measured results to predetermined values, ranges, curves, and automatically determines whether there is a possible SPC violation.

If, for example, the ESC bias voltage is zero or less than a threshold value, the wafer 106 is caused to be lifted off of the surface of the ESC 150. If however, the ESC bias voltage is not zero or greater than a threshold value, the wafer 106 is not caused to be lifted off of the surface of the ESC 150, and instead an indication is produced automatically informing the processing control system 170 thereof that there is a problem with processing tool, and, more specifically, that there is a problem with the ESC 150.

If, for example, an ESC bias spike and/or an ESC current spike has been recorded or measured and determined to be indicative of an electrostatic discharge at or near the wafer surface, due to a charge buildup within the reactor, the processing control system can be automatically informed that there is a problem with processing tool 100, and, more specifically, that there is a problem with the shower head 110.

The information about the ESC bias voltage and/or whether an ESC bias or current spike has occurred is then used by the Process Control System 170 to determine when and if an SPC violation has occurred. Furthermore, if an SPC violation has occurred, other wafers can automatically be diverted away from the processing tool 100 and, e.g., diverted to other properly functioning processing tools. Additionally, the processing tool 100 can be automatically identified or flagged as requiring inspection, maintenance, and/or repair. Finally, the wafer present in the chamber during the electrostatic discharge can be examined for physical and electrical defects to determine the extent of wafer damage.

Figure 5:
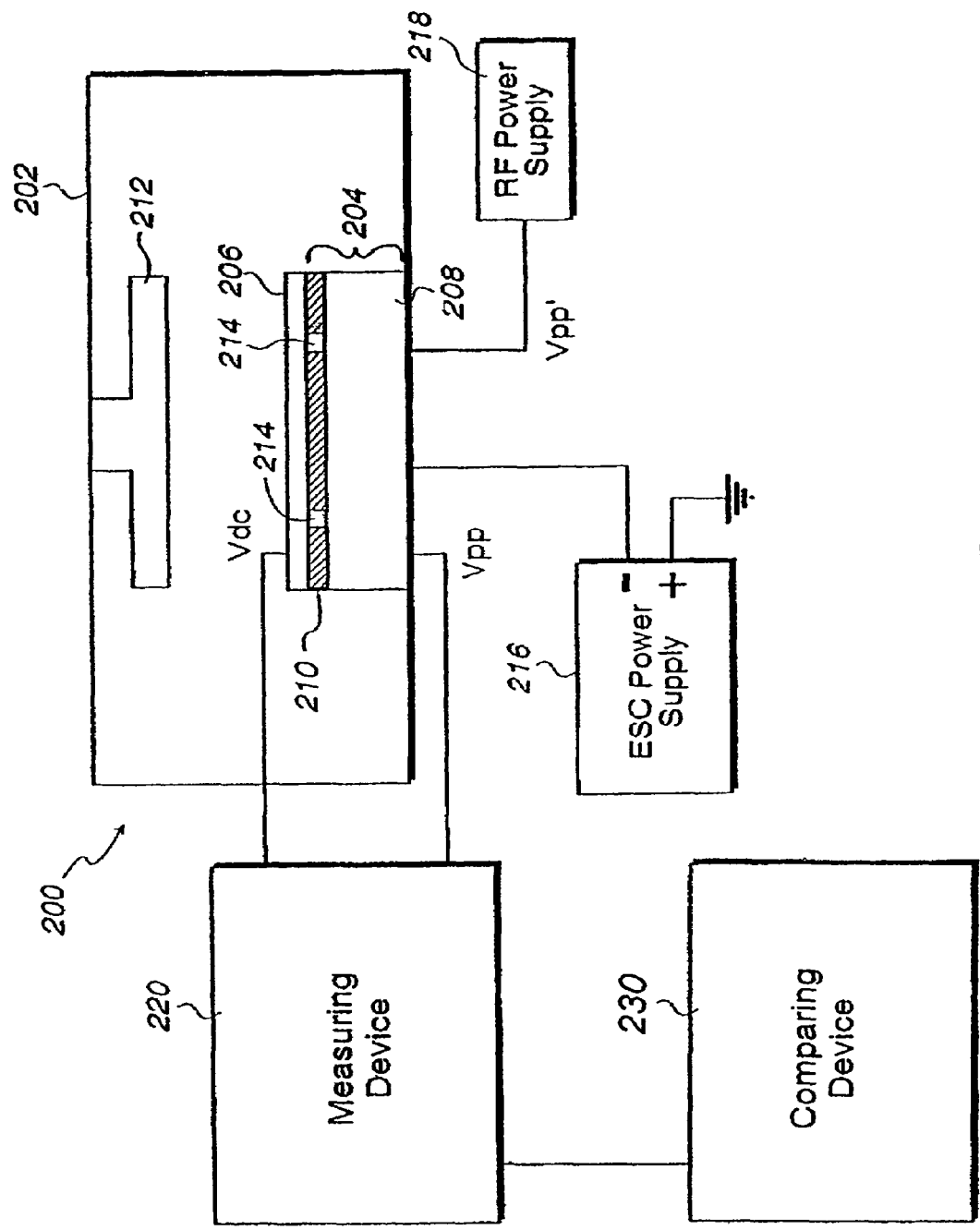
FIG. 5 shows a fifth embodiment of a processing system according to the invention.

FIG. 5 illustrates another exemplary plasma processing system that utilizes a processing tool 200 which includes a monopolar ESC 204. The plasma processing tool 200 is similar to that of FIG. 1 except that a measuring device is utilized to directly measure the wafer 206 and/or the ESC 204. Additionally, a comparing device 230 is coupled to the measuring device 220. The measuring device 220 measures, detects, or records one or more of the following features: (1) the ESC bias voltage; (2) whether an ESC bias spike has occurred; and (3) whether an ESC current spike has occurred. Then, the comparing device 230 compares the measured results to predetermined values, ranges, curves, and automatically determines whether there is a possible SPC violation.

If, for example, the ESC bias voltage is zero or less than a threshold value, the wafer 206 can be safely lifted off of the surface of the ESC 204. If however, the ESC bias voltage is not zero or greater than a threshold value, the wafer 206 is not caused to be lifted off of the surface of the chuck 204, and instead an indication is produced automatically informing the processing control system thereof that there is a problem with processing tool 200, and, more specifically, that there is possibly a problem with the ESC 204.

If, for example, an ESC bias spike and/or an ESC current spike has been recorded or measured and determined to be indicative of a faulty or malfunctioning shower head 212, an indication is produced automatically informing the processing control system thereof that there is a problem with processing tool 200, and, more specifically, that there is a problem with the shower head 212.

The information about the ESC bias voltage and/or whether an ESC bias or current spike has occurred is then used by a process control system to determine when and if an SPC violation has occurred. Furthermore, if an SPC violation has occurred, other wafers can automatically be diverted away from the processing tool 200 and, e.g., diverted to other properly functioning processing tools. Additionally, the processing tool 200 can be automatically identified or flagged as requiring inspection, maintenance, and/or repair. Of course, the configuration of the measuring device 220 and the comparing device 230 shown in FIG. 5 can also be used on a bipolar ESC of the type shown in FIGS. 3 and 4. Finally, the wafer present in the chamber during the electrostatic discharge can be examined for physical and electrical defects to determine the extent of wafer damage.

Figure 6:
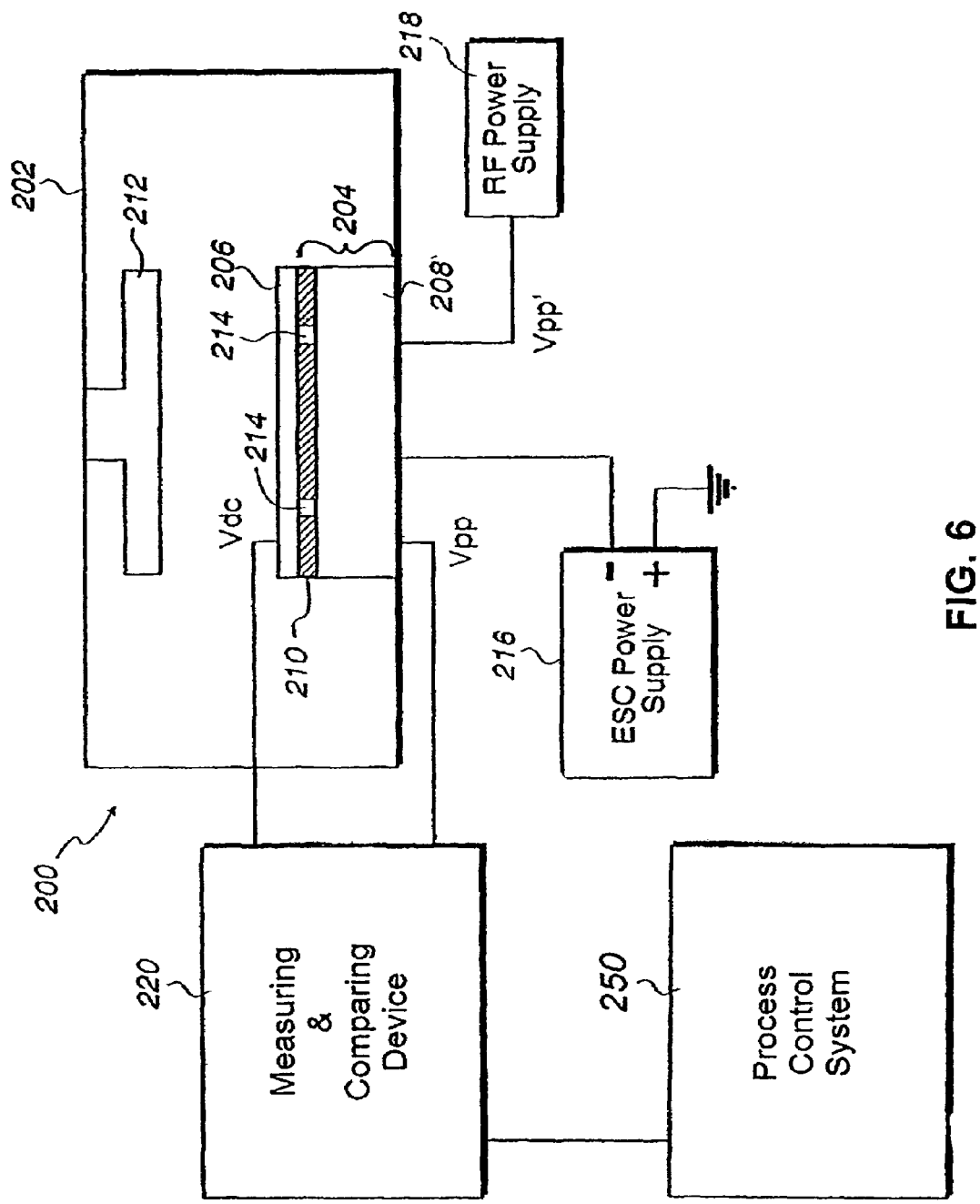
FIG. 6 shows a sixth embodiment of a processing system according to the invention.

FIG. 6 illustrates another exemplary plasma processing system utilizing a processing tool 200 that includes a monopolar ESC 204. The plasma processing tool 200 is similar to that of FIG. 5 except that a measuring and comparing device 220 is utilized to directly measure that the wafer 206 and/or the ESC 204. Additionally, a Process Control System 250 is coupled to the measuring and comparing device 220. The Process Control System 250 performs all of the functions of typical process control systems used to process wafers in automated facility. The measuring and comparing device 220 measures, detects, or records one or more of the following features: (1) the ESC bias voltage; (2) whether an ESC bias spike has occurred; and (3) whether an ESC current spike has occurred. Then, the measuring and comparing device 220 also compares the measured results to predetermined values, ranges, curves, and automatically determines whether there is a possible SPC violation. The device 220 then communicates with the Process Control System 250.

If, for example, the ESC bias voltage is zero or less than a threshold value, the wafer 206 is caused to be safely lifted off of the surface of the ESC 204. If however, the ESC bias voltage is not zero or greater than a threshold value, the wafer 206 is not caused to be lifted off of the surface of the ESC 204, and instead an indication is produced automatically informing the processing control system 250 thereof that there is a problem with processing tool 200, and, more specifically, that there is a problem with the ESC 204.

If, for example, an ESC bias spike and/or an ESC current spike has been recorded or measured and determined to be indicative of a faulty or malfunctioning shower head 212, the processing control system can be automatically informed that there is a problem with processing tool 200, and, more specifically, that there is a problem with the shower head 212.

The information about the ESC bias voltage and/or whether an ESC bias or current spike has occurred is then used by the Process Control System 250 to determine when and if an SPC violation has occurred. Furthermore, if an SPC violation has occurred, other wafers can automatically be diverted away from the processing tool 200 and, e.g., diverted to other properly functioning processing tools. Additionally, the processing tool 200 can be automatically identified or flagged as requiring inspection, maintenance, and/or repair. Of course, the configuration of the measuring and comparing device 220 and the Process Control System 250 shown in FIG. 6 can also be used on a bipolar ESC of the type shown in FIGS. 3 and 4. Finally, the wafer present in the chamber during the electrostatic discharge can be examined for physical and electrical defects to determine the extent of wafer damage.

FIGS. 7-12 are flow diagrams showing processing steps of embodiments of the invention. FIGS. 7-12 may equally represent a high-level block diagram of components of the invention implementing the steps thereof. The steps of FIGS. 7-12 may be implemented on computer program code in combination with the appropriate hardware. This computer program code may be stored on storage media such as a diskette, hard disk, CD-ROM, DVD-ROM or tape, as well as a memory storage device or collection of memory storage devices such as read-only memory (ROM) or random access memory (RAM). Additionally, the computer program code can be transferred to a workstation over the Internet or some other type of network.

FIG. 7 illustrates one exemplary method 300 according to the invention. In step 305, a wafer is processed on an ESC in a processing tool. In step 310, either during or after the processing, the wafer and/or ESC is monitored to detect an ESC bias spike and/or an ESC current spike. In step 315, a determination is made whether the spike rises to the level of an SPC violation. This could be indicative of a problem with or a malfunction of the shower head. In step 320, the method finishes.

FIG. 8 illustrates another exemplary method 400 according to the invention. In step 405, a wafer is processed on an ESC in a processing tool. In step 410, after the processing and after the power to the ESC is turned off and/or during dechucking, the wafer and/or ESC is monitored to determining when an ESC bias voltage is zero or exceeds a threshold value. In step 415, it is determined whether the answer is affirmative, and if it is, an SPC violation is issued. If the answer is no, the wafer further processed in the usual manner. In step 420, the method finishes.

FIG. 9 illustrates another exemplary method 500 according to the invention. In step 505, a wafer is processed on an ESC in a processing tool. In step 510, either during or after the processing, the wafer and/or ESC is monitored to detect an ESC bias spike and/or an ESC current spike. Alternatively, in step 510, after the processing and after the power to the ESC is turned off, the wafer or ESC is monitored to determining when an ESC bias voltage is zero or exceeds a threshold value. In step 515, it is determined whether the result of step 515 rises to the level of an SPC violation. In step 520, it is determined whether the answer is affirmative, and if it is, an SPC violation is issued. If the answer is no, the wafer further processed in the usual manner. In step 525, the method finishes.

FIG. 10 illustrates another exemplary method 600 according to the invention. In step 605, a wafer is processed on an ESC in a processing tool. In step 610, either during or after the processing, the wafer and/or ESC is monitored to detect an ESC bias spike and/or an ESC current spike. Additionally, in step 610, after the processing and after the power to the ESC is turned off, the wafer or ESC is monitored to determining when an ESC bias voltage is zero or exceeds a threshold value. In step 615, it is determined whether either of the results of step 615 rises to the level of an SPC violation. In step 620, it is determined whether the answer is affirmative, and if it is, an SPC violation is issued. If the answer is no, the wafer further processed in the usual manner. In step 625, the method finishes.

FIG. 11 illustrates another exemplary method 700 according to the invention. In step 705, a wafer is processed on an ESC in a processing tool. Either during or after the processing, in step 710 the wafer and/or ESC is monitored to detect an ESC bias spike and/or an ESC current spike. In step 715, it is determined whether either of the results of step 710 rises to the level of an SPC violation. In step 720, it is determined whether the answer is affirmative, and if it is, an SPC violation is issued and production is diverted away from the processing tool. If the answer is no, the wafer further processed in the usual manner. In step 725, the method finishes.

Figure 12:
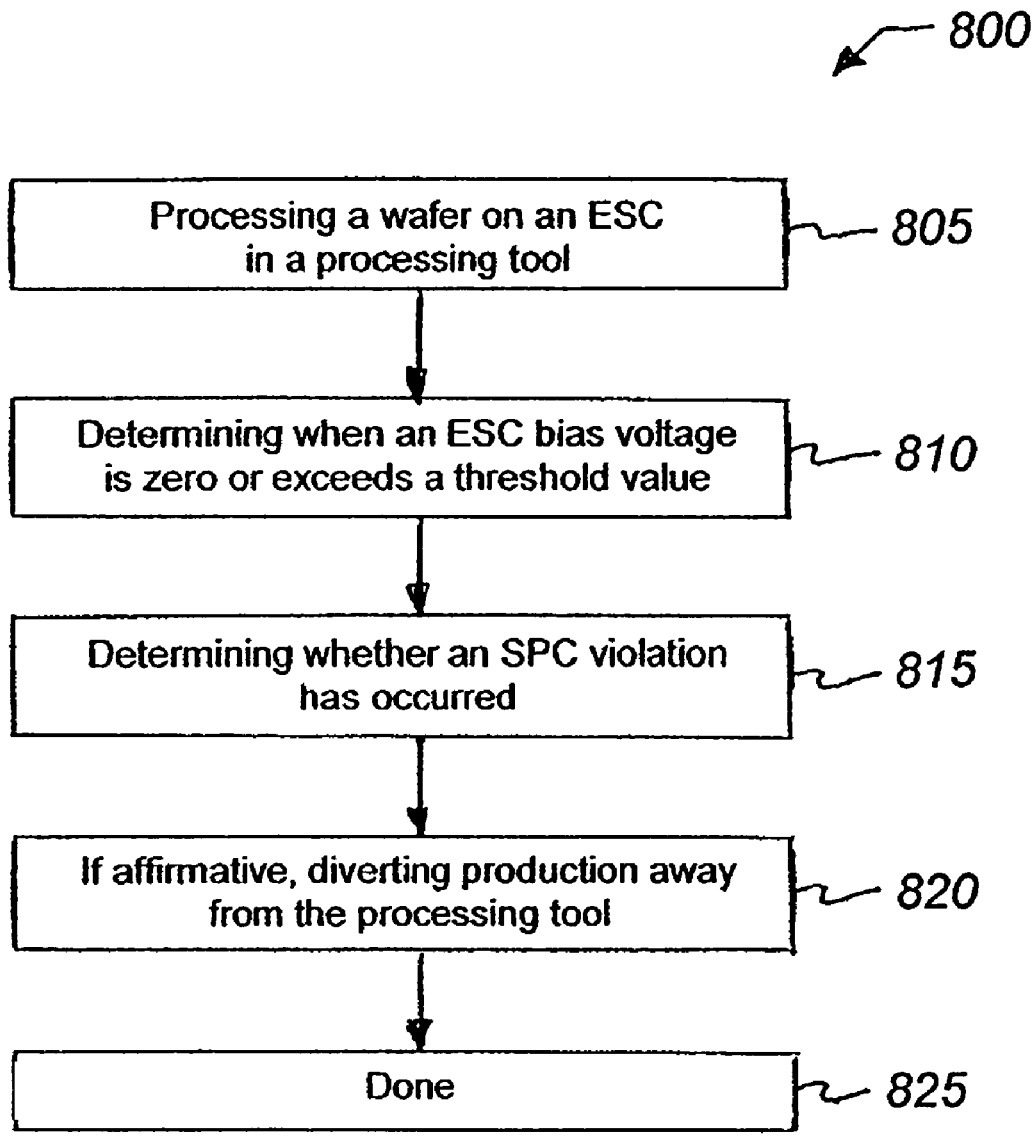
FIG. 12 shows a sixth embodiment of a processing method according to the invention.

FIG. 12 illustrates another exemplary method 800 according to the invention. In step 805, a wafer is processed on an ESC in a processing tool. After the processing and after the power to the ESC is turned off, in step 810 the wafer and/or ESC is monitored to determining when an ESC bias voltage is zero or exceeds a threshold value. In step 815, it is determined whether either of the results of step 810 rises to the level of an SPC violation. In step 820, it is determined whether the answer is affirmative, and if it is, an SPC violation is issued and production is diverted away from the processing tool. If the answer is no, the wafer further processed in the usual manner. In step 825, the method finishes.

Figure 13:
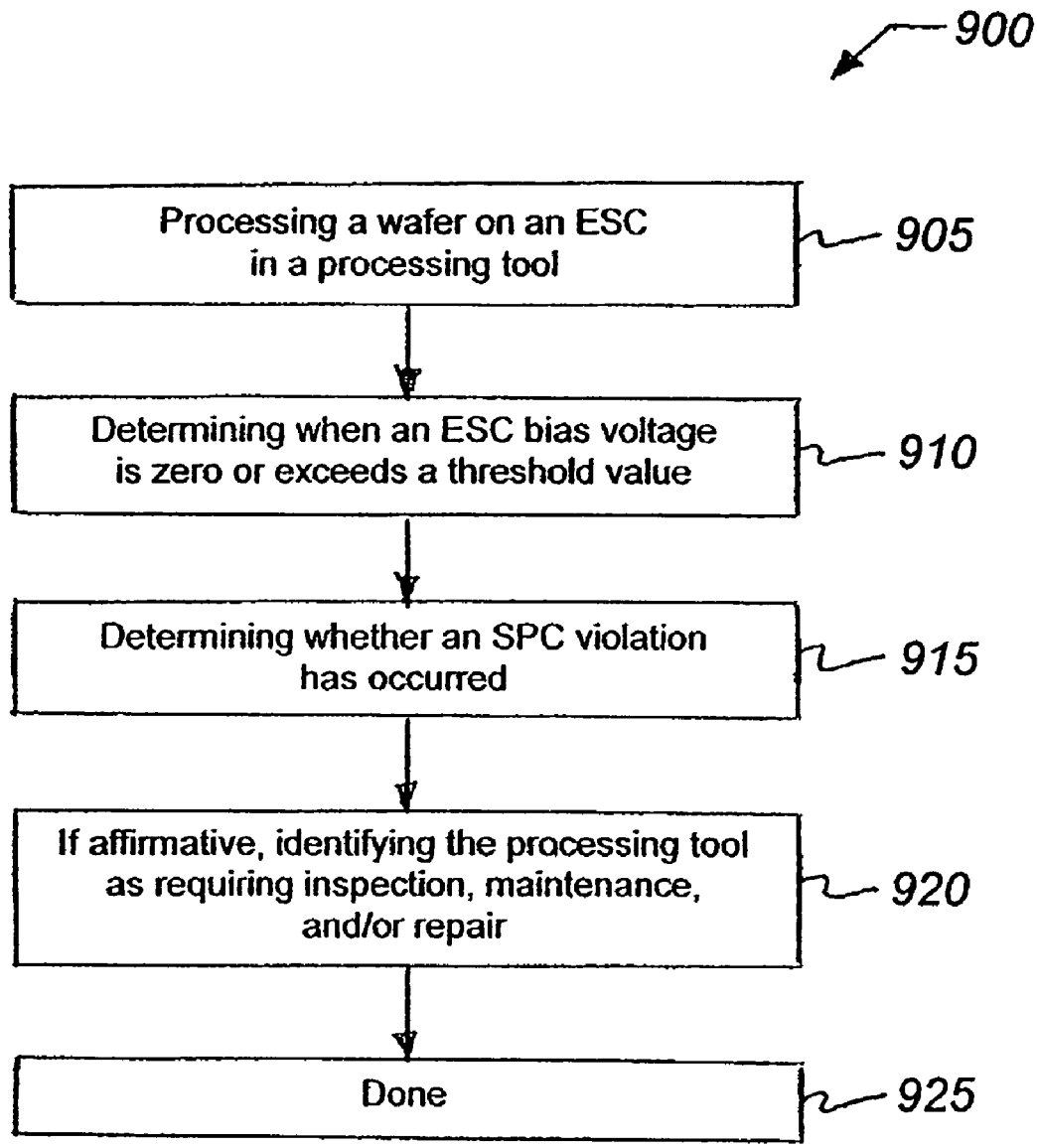
FIG. 13 shows a seventh embodiment of a processing method according to the invention.

FIG. 13 illustrates another exemplary method 900 according to the invention. In step 905, a wafer is processed on an ESC in a processing tool. After the processing and after the power to the ESC is turned off, in step 910 the wafer and/or ESC is monitored to determining when an ESC bias voltage is zero or exceeds a threshold value. In step 915, it is determined whether either of the results of step 910 rises to the level of an SPC violation. In step 920, it is determined whether the answer is affirmative, and if it is, an SPC violation is issued and the processing tool is identified or flagged as requiring inspection, maintenance, and/or repair. If the answer is no, the wafer further processed in the usual manner. In step 925, the method finishes.

Figure 14:
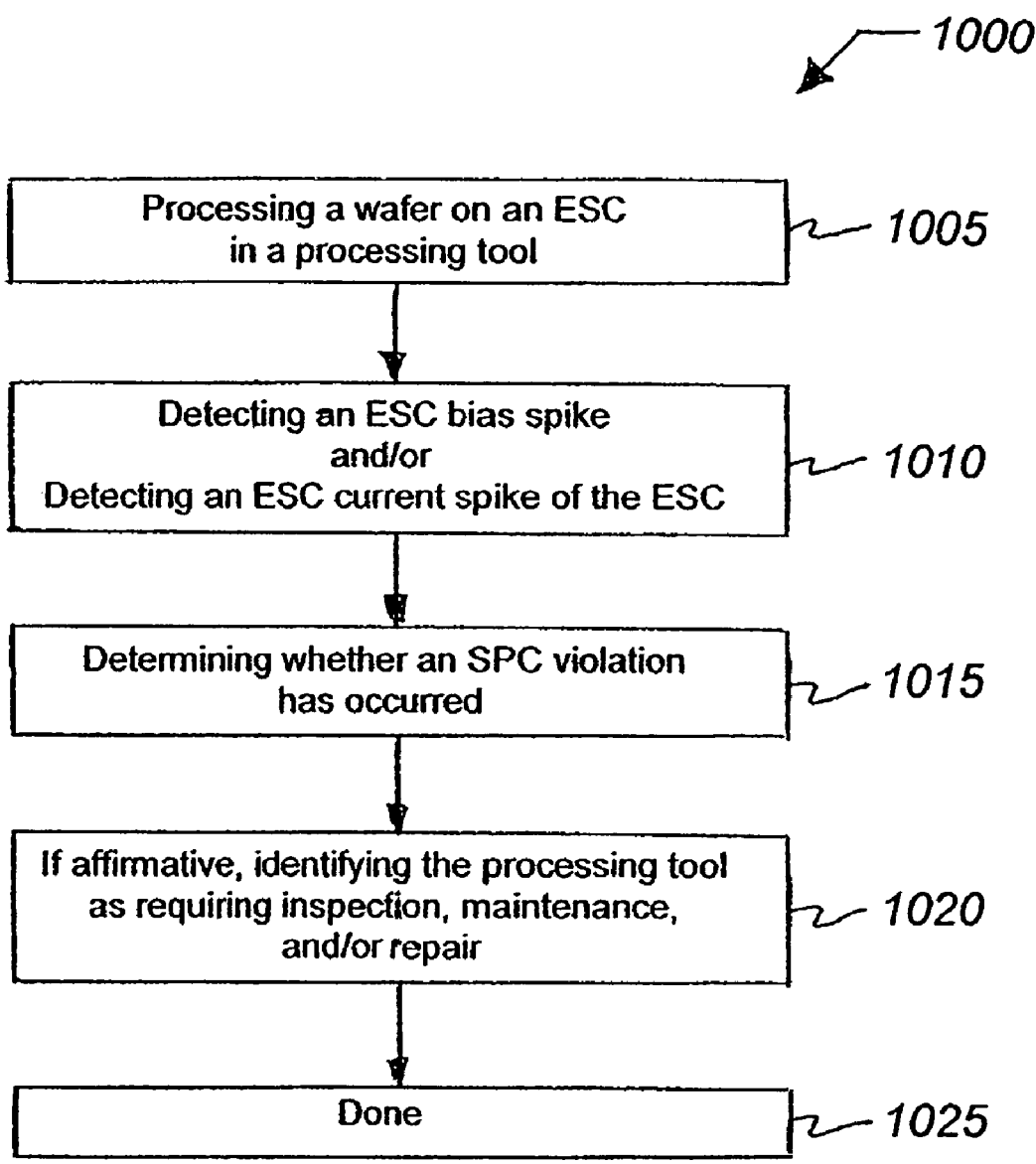
FIG. 14 shows an eight embodiment of a processing method according to the invention.

FIG. 14 illustrates another exemplary method 1000 according to the invention. In step 1005, a wafer is processed on an ESC in a processing tool. Either during or after the processing, in step 1010 the wafer and/or ESC is monitored to detect an ESC bias spike and/or an ESC current spike. In step 1015, it is determined whether either of the results of step 1010 rises to the level of an SPC violation. In step 1020, it is determined whether the answer is affirmative, and if it is, an SPC violation is issued and the processing tool is identified or flagged as requiring inspection, maintenance, and/or repair. If the answer is no, the wafer further processed in the usual manner. In step 1025, the method finishes.

Although exemplary plasma processing systems are described in detail herein to facilitate understanding of the advantages of the present invention, the invention itself is not limited to any particular type of wafer processing apparatus or tool and may be adapted for use in any of wafer processing systems, including but not limited to those adapted for deposition, oxidation, annodization, etching (including dry etching, plasma etching, reactive ion etching (RIE), magnetically enhanced reactive ion etching (MERIE), electron cyclotron resonance (ECR)), or the like. Furthermore, the invention is not limited to any type of ESC and may be adapted for use with any type of ESC or any ESC configuration.

The invention also relates to a data collection and processing system or method which measures, records, and interprets signals from the plasma reactor subsystems (e.g., RF Power supply, Electrostatic Chuck (ESC), Substrate bias voltage, Shower head bias voltage) to provide in-situ measurements, real time controls, and real time fault detection for the following exemplary situations: wafer charge distribution during plasma processing (e.g., PVD, PECVD, RIE, Plasma Strip); endpoint and etch uniformity in plasma RIE; charge accumulation of auxiliary components within the plasma chamber (Baffle plates, rings, gas distribution apparatuses, etc.,); wafer chucking and dechucking faults; and abrupt discharge (arcing) either to the wafer or to other components within the chamber. By way of non-limiting example, the data collection rates can range from about 1 Hz in the case of ESC charging to greater than 1 MHz in the case of RF arc detection. Although the invention has particular application to RIE tools (e.g., Lam RIE tools), the invention can be utilized on any plasma reactor with the appropriate subsystem sensors including other toolsets from other suppliers.

The method and apparatus as described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modifications and in the spirit and scope of the appended claims.

What is claimed:

1. A processing system, comprising:
a processing tool;
an electrostatic chuck (ESC) arranged within the processing tool; and
a system that:
  detects an ESC bias spike and an ESC current spike of the ESC; and
  determines when an ESC bias voltage is zero or exceeds a threshold value, wherein
the processing tool comprises a plasma processing apparatus,
the processing system is a wafer processing system,
the processing system:
  measures at least one of ESC voltage, ESC current, and ESC bias of a wafer,
  is structured and arranged to detect the ESC bias spike and the ESC current spike during processing, and compares at least one of:
    the ESC bias spike and/or the ESC current spike to predetermined values or ranges and determines when a statistical process control violation has occurred, and
    the ESC bias voltage to zero or the threshold value and determines when a statistical process control violation has occurred,
  evaluates at least one of: the ESC bias spike, the ESC bias voltage and the ESC current spike, and determines when a statistical process control violation has occurred, and diverts production away from the processing tool when the statistical process control violation has occurred and identifies the processing tool as requiring inspection, maintenance, and/or repair.

2. A method of processing wafers in a processing tool comprising an electrostatic chuck (ESC), the method comprising:
at least one of:
  detecting an ESC bias spike and an ESC current spike of the ESC; and
  determining when an ESC bias voltage is zero or exceeds a threshold value;
comparing the ESC bias voltage to zero or the threshold value;

evaluating at least one of ESC bias voltage, the ESC bias spike and the ESC current spike;
determining when a statistical process control violation has occurred;
diverting production away from the processing tool when the statistical process control violation has occurred; and
identifying the processing tool as requiring inspection, maintenance, and/or repair.

3. A processing system, comprising:
a processing tool;
an electrostatic chuck (ESC) arranged within the processing tool; and
a system that at least one of:
  detects an ESC bias spike and/or an ESC current spike of the ESC; and
  determines when an ESC bias voltage is zero or exceeds a threshold value,
wherein the system compares the ESC bias spike and/or the ESC current spike to predetermined values or ranges and determines when a statistical process control violation has occurred and diverts production away from the processing tool when the statistical process control violation has occurred.

4. The system of claim 3, wherein the processing tool comprises a plasma processing apparatus.

5. The system of claim 3, wherein the processing system is a wafer processing system.

6. The system of claim 3, wherein the system measures at least one of ESC voltage, ESC current, and ESC bias of a wafer.

7. The system of claim 3, wherein the system measures at least one of ESC voltage, ESC current, and ESC bias of the ESC.

8. The system of claim 3, wherein the system is structured and arranged to detect the ESC bias spike and/or the ESC current spike during processing.

9. The system of claim 3, wherein the system compares the ESC bias voltage to zero or the threshold value and determines when the statistical process control violation has occurred.

10. The system of claim 3, wherein when the system evaluates the ESC bias spike and/or the ESC current spike and determines when the statistical process control violation has occurred, the system identifies the processing tool as requiring inspection, maintenance, and/or repair.

11. The system of claim 3, wherein when the system evaluates the ESC bias voltage and determines when the statistical process control violation has occurred, the system identifies the processing tool as requiring inspection, maintenance, and/or repair.

12. A processing system, comprising:
a processing tool;
an electrostatic chuck (ESC) arranged within the processing tool; and
a system that determines when an ESC bias voltage of the ESC and/or of a wafer arranged on the ESC is zero or exceeds a threshold value,
wherein the system compares the ESC bias spike and/or the ESC current spike to predetermined values or ranges and determines when a statistical process control violation has occurred.

13. The system of claim 12, wherein the processing tool comprises a plasma processing apparatus.

14. The system of claim 12, wherein the processing system is a wafer processing system.

15. The system of claim 12, wherein the system measures at least one of ESC voltage, ESC current, and ESC bias of the wafer.

16. The system of claim 12, wherein the system measures at least one of ESC voltage, ESC current, and ESC bias of the ESC.

17. The system of claim 12, wherein the system is structured and arranged to detect an ESC bias spike and/or an ESC current spike.

18. The system of claim 12, wherein the system compares the ESC bias voltage to zero or the threshold value and determines when the statistical process control violation has occurred.

19. The system of claim 12, wherein when the system detects an ESC bias spike and/or an ESC current spike, determines when the statistical process control violation has occurred, the system diverts production away from the processing tool when the statistical process control violation has occurred.

20. The system of claim 12, wherein system evaluates the ESC bias voltage, determines when the statistical process control violation has occurred, the system diverts production away from the processing tool when the statistical process control violation has occurred.

21. The system of claim 12, wherein when the system evaluates an ESC bias spike and/or an ESC current spike, determines when the statistical process control violation has occurred, the system identifies the processing tool as requiring inspection, maintenance, and/or repair.

22. The system of claim 12, wherein when the system evaluates the ESC bias voltage, determines when the statistical process control violation has occurred, the system identifies the processing tool as requiring inspection, maintenance, and/or repair.

23. A processing system, comprising:
a processing tool;
an electrostatic chuck (ESC) arranged within the processing tool; and
a system that
  detects at least one of an ESC current spike and an ESC bias spike of at least one of a wafer and the ESC, and
  determines when an ESC bias voltage is zero or exceeds a threshold value.

24. A method of processing wafers in a processing tool comprising an electrostatic chuck (ESC), the method comprising:
at least one of:
  detecting an ESC bias spike and/or an ESC current spike of the ESC; and
  determining when an ESC bias voltage is zero or exceeds a threshold value; and
evaluating the ESC bias voltage;
determining when a statistical process control violation has occurred; and
diverting production away from the processing tool when the statistical process control violation has occurred.

25. The method of claim 24, further comprising:
comparing the ESC bias voltage to zero or the threshold value; and
determining when a statistical process control violation has occurred.

26. The method of claim 24, further comprising:
evaluating the ESC bias spike and/or the ESC current spike;
determining when the statistical process control violation has occurred; and diverting production away from the processing tool when the statistical process control violation has occurred.

27. The method of claim 24, further comprising:
at least one of:
  evaluating the ESC bias spike and/or the ESC current spike; and
  evaluating the ESC bias voltage;
determining when the statistical process control violation has occurred; and
identifying the processing tool as requiring inspection, maintenance, and/or repair.

* * * * *